US010770533B2

(12) United States Patent
Park et al.

(10) Patent No.: US 10,770,533 B2
(45) Date of Patent: Sep. 8, 2020

(54) ORGANIC LIGHT EMITTING DIODE DISPLAY PANEL HAVING PADS DISPOSED AT DIFFERENT DISTANCES FROM AN EDGE AND ORGANIC LIGHT EMITTING DIODE DISPLAY DEVICE HAVING THE SAME

(71) Applicant: LG Display Co., Ltd., Seoul (KR)

(72) Inventors: ChongHun Park, Gyeonggi-do (KR); Hooin Park, Seoul (KR); Jaeyi Choi, Gyeongsangnam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/239,462

(22) Filed: Jan. 3, 2019

(65) Prior Publication Data

US 2019/0140041 A1  May 9, 2019

Related U.S. Application Data

(62) Division of application No. 15/162,820, filed on May 24, 2016, now Pat. No. 10,211,275.

(30) Foreign Application Priority Data

Dec. 31, 2015 (KR) .................. 10-2015-0191852

(51) Int. Cl.
 *H01L 27/32* (2006.01)
(52) U.S. Cl.
 CPC ...... *H01L 27/3276* (2013.01); *H01L 27/3248* (2013.01)
(58) Field of Classification Search
 CPC .................................. H01L 27/3276
 See application file for complete search history.

(56) References Cited

U.S. PATENT DOCUMENTS 6,042,894 A    3/2000  Goto et al.
2006/0244741 A1  11/2006  Kimura et al.
(Continued)

FOREIGN PATENT DOCUMENTS

CN   101114557 A    1/2008
CN   101566769 A   10/2009
(Continued)

OTHER PUBLICATIONS

First Office Action dated Oct. 6, 2017 from the Taiwan Intellectual Property Office in related Taiwanese application No. 105140429.
(Continued)

*Primary Examiner* — Lex H Malsawma
*Assistant Examiner* — Laura M Dykes
(74) *Attorney, Agent, or Firm* — Morgan, Lewis & Bockius LLP

(57) ABSTRACT

An organic light emitting diode display panel includes data lines arranged in a first direction; gate lines arranged in a second direction to cross the data lines; a driving voltage line arranged in the first direction; a reference voltage line arranged in the first direction; data pads respectively at ends of corresponding ones of the data lines; a driving voltage pad at an end of the driving voltage line; and a reference voltage pad at an end of the reference voltage line. A first distance is defined between the driving voltage pad and an adjacent data pad, a second distance is defined between adjacent ones of the data pads, and a third distance is defined between the reference voltage pad and an adjacent data pad. At least two of the first distance, the second distance, and the third distance are different from each other.

9 Claims, 12 Drawing Sheets

(56) References Cited

U.S. PATENT DOCUMENTS

| | | |
|---|---|---|
| 2008/0024415 A1 | 1/2008 | Jung et al. |
| 2009/0128023 A1 | 5/2009 | Kwak et al. |
| 2009/0268146 A1 | 10/2009 | Kook et al. |
| 2012/0044221 A1 | 2/2012 | Ko et al. |
| 2012/0211752 A1 | 8/2012 | Kim et al. |
| 2015/0130785 A1* | 5/2015 | Shin .................. G09G 3/3233 345/213 |

FOREIGN PATENT DOCUMENTS

| | | |
|---|---|---|
| CN | 102376740 A | 3/2012 |
| JP | 2005181706 A | 7/2005 |
| KR | 20120123949 A | 11/2012 |
| TW | 201236149 A | 9/2012 |

OTHER PUBLICATIONS

First Office Action dated Sep. 30, 2018, from the Chinese Intellectual Property Office in related Chinese application No. 201611063921.8.

* cited by examiner

ORGANIC LIGHT EMITTING DIODE DISPLAY PANEL HAVING PADS DISPOSED AT DIFFERENT DISTANCES FROM AN EDGE AND ORGANIC LIGHT EMITTING DIODE DISPLAY DEVICE HAVING THE SAME

This application is a Divisional of U.S. patent application Ser. No. 15/162,820, filed May 24, 2016, which claims the benefit under 35 U.S.C. § 119(a) of Korean Patent Application No. 10-2015-0191852, filed on Dec. 31, 2015, both of which are hereby incorporated by reference for all purposes as if fully set forth herein.

BACKGROUND OF THE INVENTION

Field of the Invention

The present invention relates to an organic light emitting diode display panel and an organic light emitting diode display device having the same.

Description of the Related Art

Recently, organic electroluminescent display devices have come into the spotlight. An organic electroluminescent display device uses an organic light emitting diode (OLED) that emits light itself. Thus, an organic electroluminescent display device has a number of advantages, such as high response speed, high light emitting efficiency, high luminance, a wide viewing angle, and the like.

An organic light emitting diode display device has pixels—each including at least one organic light emitting diode—disposed in a matrix form. The organic light emitting diode display device controls the brightness of the pixels, which are selected by a scan signal, according to the gradation of data. Each pixel of the organic light emitting diode display device has a pixel structure in which an organic light emitting diode, a driving transistor for driving the organic light emitting diode, a storage capacitor, and the like are connected to various signal lines.

A pixel structure in the related art requires a reference voltage line for initializing a source node (or a drain node) of a driving transistor. Thus, the reference voltage line is formed in a display panel for each pixel and is directly connected to each data driving integrated circuit.

A data driving integrated circuit generates a data signal synchronized with a scan signal, and supplies the generated data signal to a data line. To this end, the data driving integrated circuit is electrically connected to a data pad portion through the medium of an anisotropic conductive film (ACF) according to a tape automated bonding (TAB) scheme. Also, a pad electrode of the data pad portion is electrically connected to a terminal of the data driving integrated circuit through a conductive ball in the ACF.

At this time, a plurality of signal lines connected to the data driving integrated circuit and pad electrodes connected to the plurality of signal lines are disposed at identical distances. Thus, a line defect (LD), such as a short-circuit and the like, may be caused when conductive balls gather together or a minute foreign substance permeates the device.

Also, it is impossible to inspect the elements for LDs in a non-compensation state and it is difficult to detect the LDs, and the LDs become a factor that results in further lost costs associated with additionally attached materials when a complete product is manufactured.

SUMMARY OF THE INVENTION

Accordingly, the present invention is directed to an organic light emitting diode display panel and organic light emitting diode display device having the same that substantially obviates one or more of the problems due to limitations and disadvantages of the related art.

An object of the present invention is to provide an organic light emitting diode display panel that has reduced occurrences of line defects.

Another object of the present invention is to provide an organic light emitting diode display panel in which line defects can be more readily detected during an inspection.

Another object of the present invention is to provide an organic light emitting diode display panel having improved yield and reduced cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting diode display panel comprises a plurality of data lines arranged in a first direction; a plurality of gate lines arranged in a second direction to cross the data lines, a plurality of pixel areas being defined by the crossed data lines and gate lines; at least one driving voltage line arranged in the first direction; at least one reference voltage line arranged in the first direction; a plurality of data pads respectively disposed at ends of corresponding ones of the data lines; a driving voltage pad disposed at an end of the driving voltage line; and a reference voltage pad disposed at an end of the reference voltage line; wherein a first distance is defined between the driving voltage pad and an adjacent data pad, a second distance is defined between adjacent ones of the data pads, and a third distance is defined between the reference voltage pad and an adjacent data pad, and wherein at least two of the first distance, the second distance, and the third distance are different from each other.

In another aspect, an organic light emitting diode display panel comprises a plurality of data lines arranged in a first direction; a plurality of gate lines arranged in a second direction to cross the data lines, a plurality of pixel areas being defined by the crossed data lines and gate lines; at least one driving voltage line arranged in the first direction; at least one reference voltage line arranged in the first direction; a plurality of data pads respectively disposed at ends of corresponding ones of the data lines; a driving voltage pad disposed at an end of the driving voltage line; and a reference voltage pad disposed at an end of the reference voltage line, wherein each of the data pads, the driving voltage pad, and the reference voltage pad are disposed in a non-active area of the display panel adjacent to an edge of the display panel, wherein a first distance from the edge of the display panel to the data pads is different than a second distance from the edge of the display panel to the driving voltage pad, and wherein the first distance from the edge of the display panel to the data pads is different than a third distance from the edge of the display panel to the driving voltage pad.

In another aspect, an organic light emitting diode display device comprises a display panel including: a plurality of data lines arranged in a first direction, a plurality of gate lines arranged in a second direction to cross the data lines, a plurality of pixel areas being defined by the crossed data lines and gate lines, at least one driving voltage line arranged in the first direction, at least one reference voltage line arranged in the first direction, a plurality of data pads respectively disposed at ends of corresponding ones of the data lines, a driving voltage pad disposed at an end of the driving voltage line, and a reference voltage pad disposed at an end of the reference voltage line; and an integrated circuit attached to the display panel, the integrated circuit having a plurality of terminals each connected to a respective one of the data pads, the driving voltage pad, and the reference voltage pad, wherein a first distance is defined between the driving voltage pad and an adjacent data pad, a second distance is defined between adjacent ones of the data pads, and a third distance is defined between the reference voltage pad and an adjacent data pad, and wherein at least two of the first distance, the second distance, and the third distance are different from each other.

In another aspect, an organic light emitting diode display device comprises a display panel including: a plurality of data lines arranged in a first direction, a plurality of gate lines arranged in a second direction to cross the data lines, a plurality of pixel areas being defined by the crossed data lines and gate lines, at least one driving voltage line arranged in the first direction, at least one reference voltage line arranged in the first direction, a plurality of data pads respectively disposed at ends of corresponding ones of the data lines, a driving voltage pad disposed at an end of the driving voltage line, and a reference voltage pad disposed at an end of the reference voltage line; and an integrated circuit attached to the display panel, the integrated circuit having a plurality of terminals each connected to a respective one of the data pads, the driving voltage pad, and the reference voltage pad, wherein each of the data pads, the driving pad, and the reference voltage pad are disposed in a non-active area of the display panel adjacent to an end of the display panel, wherein a first distance from the edge of the display panel to the data pads is different than a second distance from the edge of the display panel to the driving voltage pad, and wherein the first distance from the edge of the display panel to the data pads is different than a third distance from the edge of the display panel to the driving voltage pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
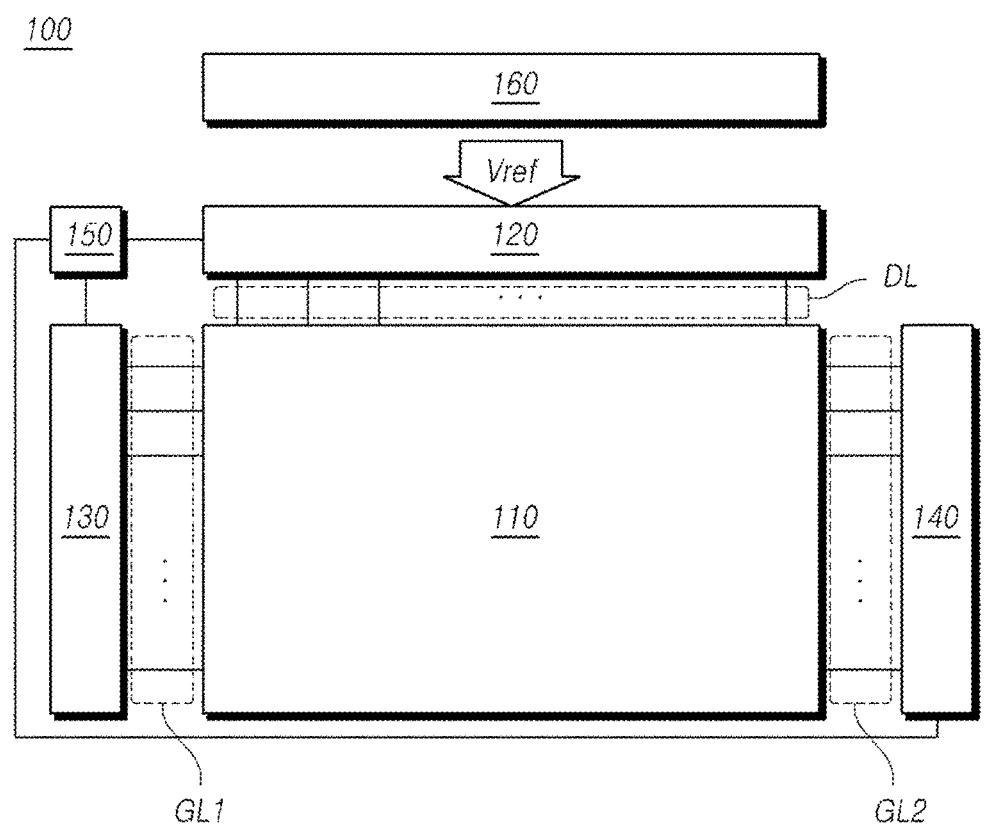
FIG. 1 is a view illustrating a schematic system configuration of an organic light emitting diode display device according to example embodiments of the present invention.

Hereinafter, reference will be made in detail to embodiments of the present invention, examples of which are illustrated in the accompanying drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a view illustrating a schematic system configuration of an organic light emitting diode display device according to example embodiments of the present invention.

As shown in FIG. 1, the organic light emitting diode display device 100 may include a display panel 110, a data driver 120, a first gate driver 130, a second gate driver 140, a timing controller 150, and a reference voltage supplier 160. The display panel 110 has a plurality of data lines DL, a plurality of first gate lines GL1, and a plurality of second gate lines GL2 that are formed therein to define a plurality of pixels. The data driver 120 drives the plurality of data lines DL formed in one direction in the display panel 110. The first gate driver 130 supplies a scan signal through the first gate lines GL1 disposed in a different direction so as to intersect the data lines DL in the display panel 110. The second gate driver 140 supplies a sense signal through the second gate lines GL2 formed in parallel with the first gate lines GL1 in the display panel 110. The timing controller 150 controls a driving timing of each of the data driver 120, the first gate driver 130, and the second gate driver 140. The reference voltage supplier 160 supplies various voltages, for example, a reference voltage Vref which is a common voltage, to the respective pixels.

The organic light emitting diode display panel 110 includes a plurality of signal lines, and an integrated circuit bonding part to which an integrated circuit connected to the plurality of signal lines to supply a signal to the plurality of signal lines is bonded, as described below. In the present example, the integrated circuit bonding part may include a plurality of lower pad electrodes that are connected to the plurality of signal lines; and a plurality of upper pad electrodes that are connected to the respective plurality of lower pad electrodes through contact holes, and are disposed such that at least one of a distance, a length, and a location is differently applied on an identical plane.

Also, the data driver 120 may include a plurality of data driving integrated circuits (which are also referred to as "source driving integrated circuits"). The plurality of data driving integrated circuits may be connected to a bonding pad of the display panel 110 according to a TAB scheme or a chip-on-glass (COG) scheme, or may be implemented in a gate-in-panel (GIP) type and may be directly formed in the display panel 110. Alternatively, the data driver 120 may be integrated into the display panel 110.

The first gate driver 130 and the second gate driver 140 may be separately implemented, or may be included in one gate driver in some cases. The first gate lines GL1 and the second gate lines GL2 may share one gate line GL, and may supply a sense signal and a scan signal through the one gate line GL.

Also, according to a driving type, the first gate driver 130 may be disposed at only one side of the display panel 110 as illustrated in FIG. 1, or the first gate driver 130 may be divided into two parts and the two parts may be disposed at both sides of the display panel 110. The second gate driver 140 may be disposed as in the case of the first gate driver 130.

Further, each of the first gate driver 130 and the second gate driver 140 may include a plurality of gate driving integrated circuits. The plurality of gate driving integrated circuits may be connected to a bonding pad of the display panel 110 according to the TAB scheme or the COG scheme, or may be implemented in a gate-in-panel (GIP) type and may be directly formed in the display panel 110. Alternatively, the first gate driver 130 and the second gate driver 140 may be integrated into the display panel 110. The reference voltage supplier 160 may be connected to the data driving integrated circuits D-IC of the data driver 120, and may supply a reference voltage Vref to a reference voltage line RVL, that is formed in the display panel 110, through the data driving integrated circuits D-IC.

Figure 2:
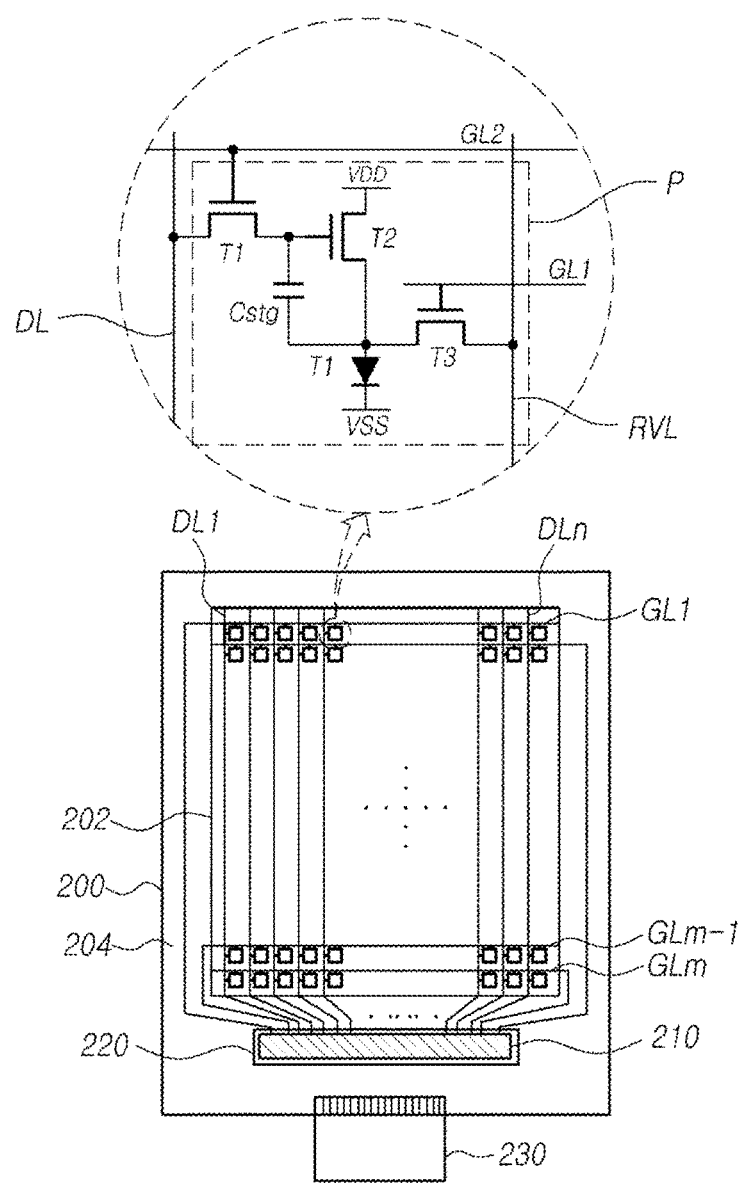
FIG. 2 is a view schematically illustrating a structure of an organic light emitting diode display panel according to example embodiments of the present invention.

Hereinafter, with reference to FIG. 2, a description will be made of a structure of the display panel 110 of the organic light emitting diode display device 100 according to an example embodiment of the present invention. FIG. 2 is a view schematically illustrating a structure of an organic light emitting diode display panel according to example embodiments of the present invention.

The display panel 200 may include an active area 202, which displays an image, and a non-active area 204 corresponding to a remaining area except for the active area 202. The active area 202 may include a plurality of first gate lines GL1 to GLm and a plurality of data lines DL1 to DLn that are formed at predetermined distances intersecting each other, and a plurality of pixels P respectively defined by intersections between the plurality of first gate lines GL1 to GLm and the plurality of data lines DL1 to DLn.

A pixel P includes a first transistor T1 connected to one first gate line GL1 and one data line DL. The pixel P displays an image corresponding to a data signal supplied from the data line DL through a second transistor T2. For example, the pixel P may become a light-emitting cell that displays an image such that an OLED emits light according to a current corresponding to a data signal supplied from the data line DL through the second transistor T2.

The pixel P includes a third transistor T3 that is connected to one second gate line GL2 and one reference voltage line RVL. A reference voltage Vref supplied from the reference voltage line RVL is supplied to one of a source or a drain of the second transistor T2 through the third transistor T3, and a characteristic value (e.g., a threshold voltage or mobility) of the second transistor T2 may be sensed through the reference voltage line RVL.

The non-active area 204 may include an integrated circuit bonding part 220, to which a driving integrated circuit 210 is bonded in order to not only supply a scan signal to the first gate lines GL1 to GLm, but also to supply a data signal synchronized with the scan signal to the data signal lines DL1 to DLn. The driving integrated circuit 210 may supply a scan signal and a data signal to display an image on the display panel 200 on the basis of driving power, a synchronization signal, and image data which are received from a flexible printed circuit 230.

Figure 3:
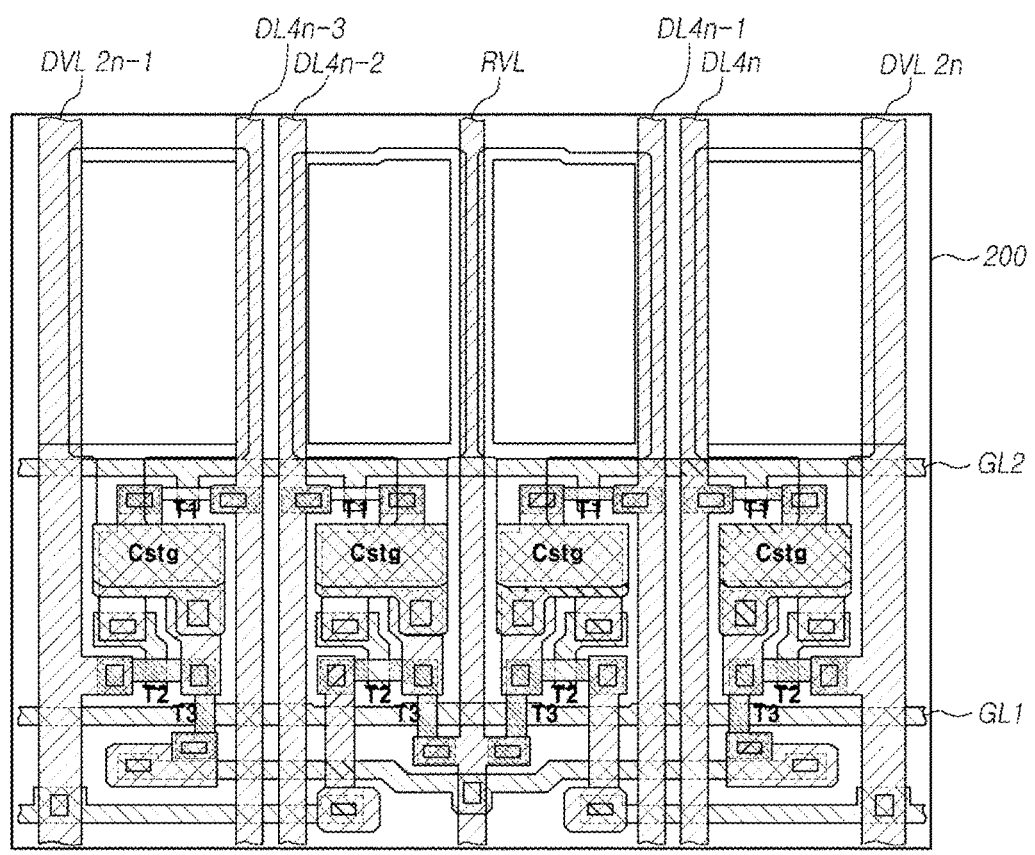
FIG. 3 is a view illustrating an example of a pixel structure of the display panel illustrated in FIG. 2.

FIG. 3 is a view illustrating an example of a pixel structure of the display panel illustrated in FIG. 2.

As shown in FIG. 3, the display panel 200 may include vertical signal lines that include a plurality of data lines DL, a plurality of driving voltage lines DVL, and a reference voltage line RVL; and horizontal signal lines that include first gate lines GL1 and second gate lines GL2.

Also, the display panel 200 may be divided by the vertical signal lines, and may include a pixel P1 connected to a (4n-3)-th data line DL4n-3, a pixel P2 connected to a (4n-2)-th data line DL4n-2, a pixel P3 connected to a (4n-1)-th data line DL4n-1, and a pixel P4 connected to a 4n-th data line DL4n.

In the present example, a reference voltage line RVL that supplies a reference voltage Vref may be disposed to correspond to a plurality of columns of pixels for every column of pixels. For example, a reference voltage line RVL may be disposed to correspond to four pixels P1 to P4. Further, (2n-1)-th and 2n-th driving voltage lines DVL2n-1 and DVL2n that supply a driving voltage VDD may be disposed on both sides of the four pixels P1 to P4.

The structure of the display panel 200 illustrated as an example in FIG. 3 may be a structure suitable for being applied to a display panel having pixels patterned in red, green, blue, and white (RGBW). Specifically, the pixels P1 to P4 may be RGBW pixels, but are not limited thereto.

Figure 4:
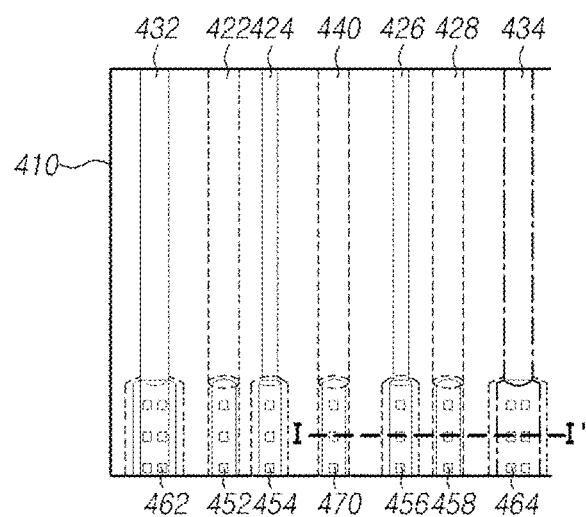
FIG. 4 is a view for explaining an integrated circuit bonding part according to a first example embodiment of the present invention.
Figure 5:
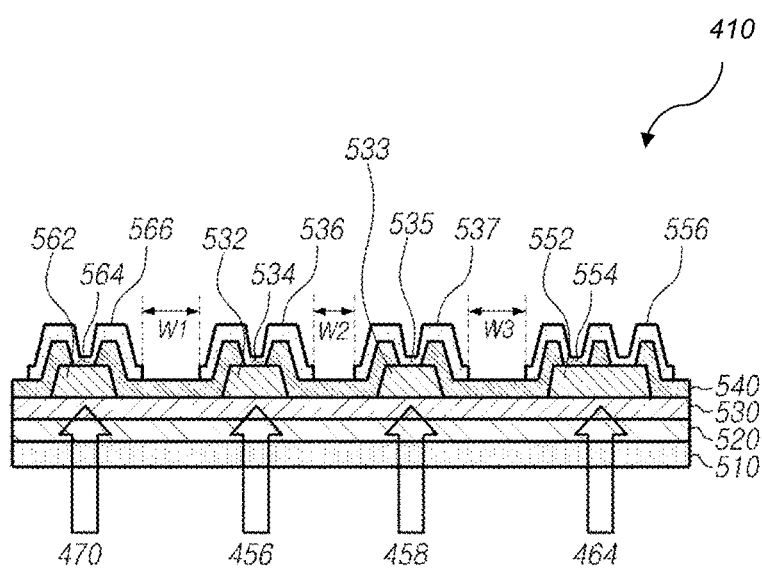
FIG. 5 is a view illustrating a structure of a cross-section taken along the line I-I' of FIG. 4.

FIG. 4 is a view for explaining an integrated circuit bonding part according to a first example embodiment of the present invention. FIG. 5 is a view illustrating a structure of a cross-section taken along the line I-I' of FIG. 4.

With reference to FIG. 4, the integrated circuit bonding part 410 may have, disposed therein, a plurality of data lines 422, 424, 426, and 428, a plurality of driving voltage lines 432 and 434, and a reference voltage line 440, that are extended in one direction.

In the present example, the plurality of data lines 422, 424, 426, and 428 may be divided into the first to fourth data lines 422, 424, 426, and 428 that deliver data signals to respective RGBW pixels. The first to fourth data lines 422, 424, 426, and 428 may respectively correspond to the (4n-3)-th data lines DL4n-3, the (4n-2)-th data lines DL4n-2, the (4n-1)-th data lines DL4n-1, and the 4n-th data lines DL4n, as illustrated in FIG. 3.

The first data line 422 and the second data line 424 may be disposed between the first driving voltage line 432 and the reference voltage line 440. The first driving voltage line 432 may correspond to the (2n-1)-th driving voltage line DVL2n-1, as illustrated in FIG. 3. The reference voltage line 440 may correspond to the reference voltage line RVL, as illustrated in FIG. 3.

The third data line 426 and the fourth data line 428 may be disposed between the second driving voltage line 434 and the reference voltage line 440. The second driving voltage line 434 may correspond to the 2n-th driving voltage line DVL2n.

The integrated circuit bonding part 410 includes a plurality of lower pad electrodes that are connected to a plurality of signal lines; and a plurality of upper pad electrodes that are connected to the respective lower pad electrodes through contact holes, and are disposed such that at least one of a distance, a length, and a location is differently applied on an identical plane. The plurality of upper pad electrodes include a plurality of upper data pad electrodes, a plurality of upper driving voltage pad electrodes, and an upper reference voltage pad electrode that are electrically connected to a plurality of data lines, a plurality of driving voltage lines, and a reference voltage line, respectively.

Specifically, the integrated circuit bonding part 410 may have, disposed therein, a plurality of data pad portions 452, 454, 456, and 458, a plurality of driving voltage pad portions 462 and 464, and a reference voltage pad portion 470 that are electrically connected to the plurality of data lines 422, 424, 426, and 428, the plurality of driving voltage lines 432 and 434, and the reference voltage line 440, respectively.

In the present example, with reference to FIG. 5, the data pad portions 456 and 458 may include lower data pad electrodes 532 and 533, data contact holes 534 and 535, and upper data pad electrodes 536 and 537, that are disposed on a buffer layer 520 and an insulating layer 530 on a substrate 510.

The lower data pad electrodes 532 and 533 may be electrically connected to data lines DL that supply data signals. The data contact holes 534 and 535 may be formed by removing partial areas of a passivation layer 540, which covers the lower data pad electrodes 532 and 533, and may expose partial areas of the lower data pad electrodes 532 and 533. The upper data pad electrodes 536 and 537 are disposed on the passivation layer 540, and are connected to the lower data pad electrodes 532 and 533 through the data contact holes 534 and 535, respectively.

The driving voltage pad portion 464 may include a lower driving voltage pad electrode 552, a driving voltage contact hole 554, and an upper driving voltage pad electrode 556, that are disposed on the buffer layer 520 and the insulating layer 530 on the substrate 510.

The lower driving voltage pad electrode 552 may be electrically connected to a driving voltage line DVL that supplies a driving voltage. The driving voltage contact hole 554 may be formed by removing a partial area of the passivation layer 540 that covers the lower driving voltage pad electrode 552, and may expose a partial area of the lower driving voltage pad electrode 552. The upper driving voltage pad electrode 556 is disposed on the passivation layer 540, and is connected to the lower driving voltage pad electrode 552 through the driving voltage contact hole 554.

The reference voltage pad portion 470 may include a lower reference voltage pad electrode 562, a reference voltage contact hole 564, and an upper reference voltage pad electrode 566, that are disposed on the buffer layer 520 and the insulating layer 530 on the substrate 510. The lower reference voltage pad electrode 562 may be electrically connected to the reference voltage line RVL that supplies a reference voltage Vref. The reference voltage contact hole 564 may be formed by removing a partial area of the passivation layer 540, that covers the lower reference voltage pad electrode 562, and may expose a partial area of the lower reference voltage pad electrode 562. The upper reference voltage pad electrode 566 is disposed on the passivation layer 540, and is connected to the lower reference voltage pad electrode 562 through the reference voltage contact hole 564.

The integrated circuit bonding part 410 may have the plurality of upper data pad electrodes 536 and 537, the upper driving voltage pad electrode 556, and the upper reference voltage pad electrode 566, that are disposed at different distances on an identical plane.

Specifically, in the integrated circuit bonding part 410, the upper reference voltage pad electrode 566 and the upper data pad electrode 536 may be spaced from each other by a first distance W1, the plurality of upper data pad electrodes 536 and 537 may be spaced from each other by a second distance W2, and the upper data pad electrode 537 and the upper driving voltage pad electrode 556 may be spaced from each other by a third distance W3. In the present example, the first distance W1 may be larger than the second distance W2. Also, the third distance W3 may be larger than the first distance W1.

The first distance may be larger by the size of at least one conductive ball than the second distance. For example, the first distance W1 may be set to be larger than the second distance W2 by about 4 μm, which is the size of one conductive ball. In the present example, the first distance W1 may be set to be larger by the size of one conductive ball than the second distance W2, and can prevent conductive balls, that gather together at the upper reference voltage pad electrode 566, and conductive balls, that gather together at the upper data pad electrodes 536, from contacting each other.

Figure 6:
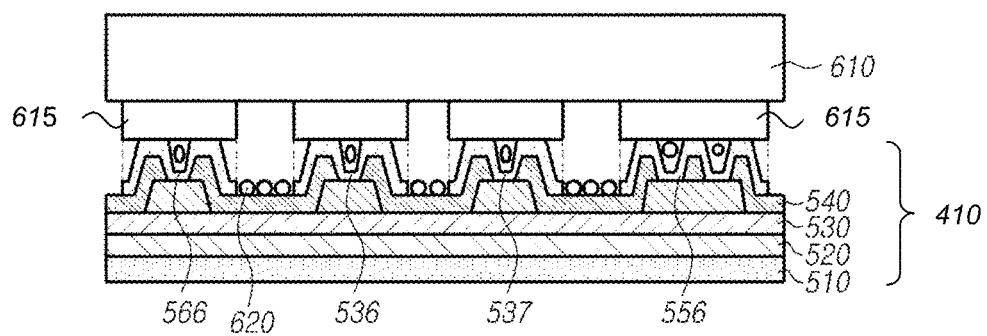
FIG. 6 is a view illustrating a state of attaching an integrated circuit to the integrated circuit bonding part illustrated in FIG. 5.

FIG. 6 is a view illustrating a state of attaching an integrated circuit 610 to the integrated circuit bonding part 410 illustrated in FIG. 5. Here, the integrated circuit part 610 includes terminals 615 respectively connected to the upper data pad electrodes 536 and 537, the upper driving voltage pad electrode 556, and the upper reference voltage pad electrode 566.

As shown in FIG. 6, in the integrated circuit bonding part 410, a distance between the upper reference voltage pad electrode 566 and the upper data pad electrode 536 is designed to be larger than a distance between the upper data pad electrodes 536 and 537 so that failures, such as short-circuits and the like, can be prevented although conductive balls 620 gather together when an integrated circuit 610 is attached.

Figure 7:
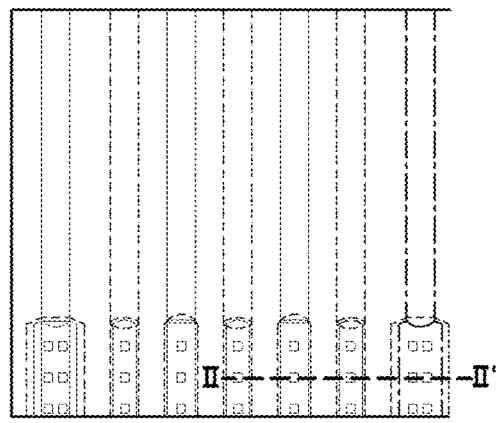
FIG. 7 is a view for explaining an integrated circuit bonding part according to a comparative example.
Figure 8:
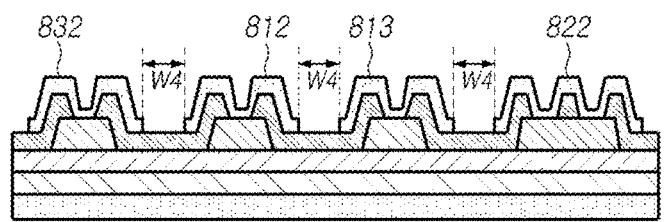
FIG. 8 is a view illustrating a structure of a cross-section taken along line II-II' of FIG. 7.

FIG. 7 is a view for explaining an integrated circuit bonding part according to a comparative example. FIG. 8 is a view illustrating a structure of a cross-section taken along line II-II' of FIG. 7.

In FIGS. 7 and 8, a structure of the integrated circuit bonding part according to a comparative example may be identical to the structure of the integrated circuit bonding part according to an example embodiment of the present invention as described above with reference to FIG. 4 to FIG. 6. Meanwhile, the integrated circuit bonding part according to a comparative example has a plurality of upper data pad electrodes 812 and 813, an upper driving voltage pad electrode 822, and an upper reference voltage pad electrode 832, that are spaced from each other by equal distances W4 on an identical plane.

For example, the integrated circuit bonding part according to a comparative example has the upper data pad electrodes 812 and 813, the upper driving voltage pad electrode 822, and the upper reference voltage pad electrode 832, that are spaced from each other by the equal distances W4.

Figure 9:
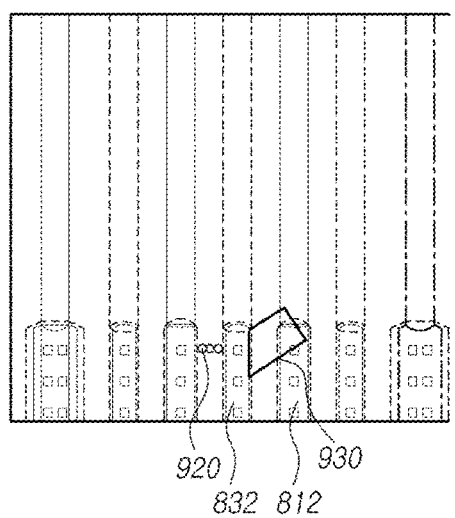
FIG. 9 is a view illustrating a state of occurrence of failure in the integrated circuit bonding part illustrated in FIG. 7.
Figure 10:
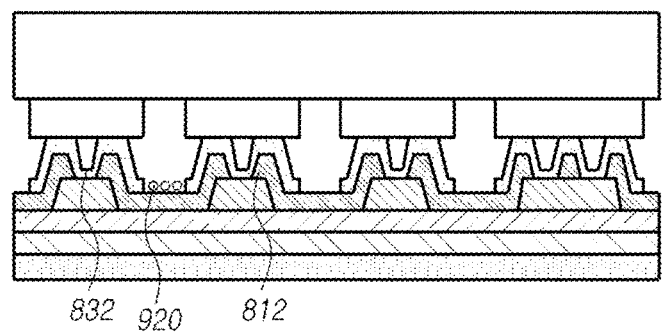
FIG. 10 is a view illustrating a state of attaching an integrated circuit to the integrated circuit bonding part illustrated in FIG. 8.

FIG. 9 is a view illustrating a state of occurrence of failure in the integrated circuit bonding part illustrated in FIG. 7. FIG. 10 is a view illustrating a state of attaching an integrated circuit to the integrated circuit bonding part illustrated in FIG. 8.

With reference to FIGS. 9 and 10, in the integrated circuit bonding part according to a comparative example of the present invention, it may be confirmed that conductive balls 920 gather together or a minute foreign substance 930 permeates and thus, a short-circuit occurs between a reference voltage pad electrode 832 and a data pad electrode 812, so that failure occurs.

Figure 11:
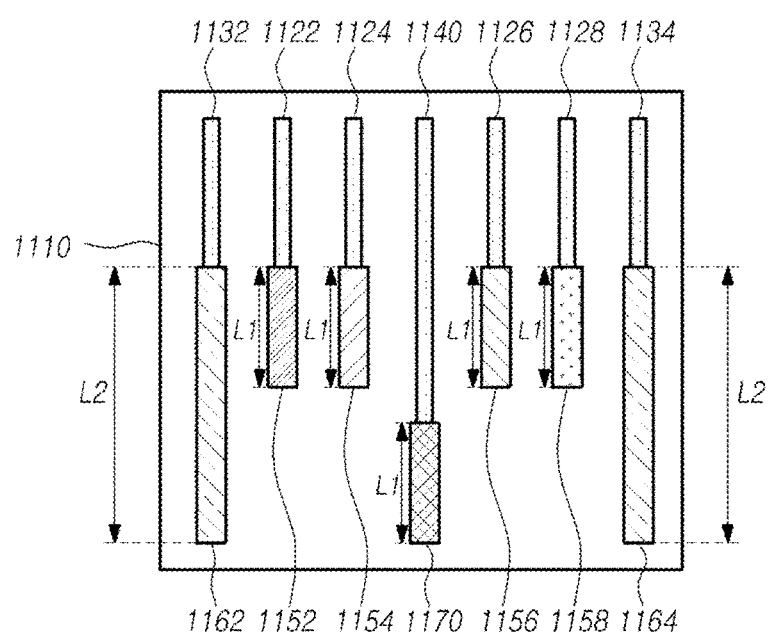
FIG. 11 is a view for explaining an integrated circuit bonding part according to a second example embodiment of the present invention.

FIG. 11 is a view for explaining an integrated circuit bonding part according to a second example embodiment of the present invention.

As shown in FIG. 11, the integrated circuit bonding part 1110 according to the second example embodiment of the present invention may have, disposed therein, a plurality of data lines 1122, 1124, 1126, and 1128, a plurality of driving voltage lines 1132 and 1134, and a reference voltage line 1140, that are extended in one direction. In the present example, the plurality of data lines 1122, 1124, 1126, and 1128 may be divided into first to fourth data lines 1122, 1124, 1126, and 1128 that deliver data signals to respective RGBW pixels. The first data line 1122 and the second data line 1124 may be disposed between the first driving voltage line 1132 and the reference voltage line 1140. The third data line 1126 and the fourth data line 1128 may be disposed between the second driving voltage line 1134 and the reference voltage line 1140.

Also, the integrated circuit bonding part 1110 may have, disposed therein, a plurality of data pad electrodes 1152, 1154, 1156, and 1158, a plurality of driving voltage pad electrodes 1162 and 1164, and a reference voltage pad electrode 1170, that are electrically connected to the plurality of data lines 1122, 1124, 1126, and 1128, the plurality of driving voltage lines 1132 and 1134, and the reference voltage line 1140, respectively.

In the present example, the plurality of data pad electrodes 1152, 1154, 1156, and 1158, the plurality of driving voltage pad electrodes 1162 and 1164, and the reference voltage pad electrode 1170 may have respective pad electrodes that are formed therein with different lengths, or are disposed at different locations with a lengthwise direction as a reference. The plurality of data pad electrodes 1152, 1154, 1156, and 1158, the plurality of driving voltage pad electrodes 1162 and 1164, and the reference voltage pad electrode 1170 may have the respective pad electrodes that are disposed such that at least one of a length and a location is differently applied to the pad electrodes on an identical plane, as described below.

Lengths of the driving voltage pad electrodes 1162 and 1164 may be different from one of those of the plurality of data pad electrodes 1152, 1154, 1156, and 1158, and that of the reference voltage pad electrode 1170. For example, as illustrated in FIG. 11, the plurality of data pad electrodes 1152, 1154, 1156, and 1158, and the reference voltage pad electrode 1170 all have a first length L1, and the driving voltage pad electrodes 1162 and 1164 both have a second length L2. In the present example, the first length L1 may be shorter than the second length L2. Also, the plurality of data pad electrodes 1152, 1154, 1156, and 1158, and the reference voltage pad electrode 1170 may be disposed at different locations with the lengthwise direction as a reference.

Specifically, the driving voltage pad electrodes 1162 and 1164 may be formed to be longer than the plurality of data pad electrodes 1152, 1154, 1156, and 1158, and the reference voltage pad electrode 1170. For example, the driving voltage pad electrodes 1162 and 1164 may be formed to be twice longer than the plurality of data pad electrodes 1152, 1154, 1156, and 1158, and the reference voltage pad electrode 1170. Here, the first and second driving voltage lines 1132 and 1134 may carry higher currents, and therefore, the driving voltage pad electrodes 1162 and 1164 may be longer to have better electrical connection and reduced heating.

Also, the plurality of data pad electrodes 1152, 1154, 1156, and 1158, and the reference voltage pad electrode 1170 may be formed to have an identical length. In this regard, the plurality of data pad electrodes 1152, 1154, 1156, and 1158, and the reference voltage pad electrode 1170 may be disposed at different locations with the lengthwise direction as a reference. For example, the reference voltage line 1140 may be extended to be longer than the data lines 1122, 1124, 1126, and 1128, and the reference voltage pad electrode 1170 may be disposed at a location which is more distant than those of the plurality of data pad electrodes 1152, 1154, 1156, and 1158 with the lengthwise direction as a reference.

As another example, the plurality of data pad electrodes 1152, 1154, 1156, and 1158, and the reference voltage pad electrode 1170 may be formed with different lengths. In this regard, the plurality of data pad electrodes 1152, 1154, 1156, and 1158, and the reference voltage pad electrode 1170 may be disposed at different locations with the lengthwise direction as a reference.

Figure 12:
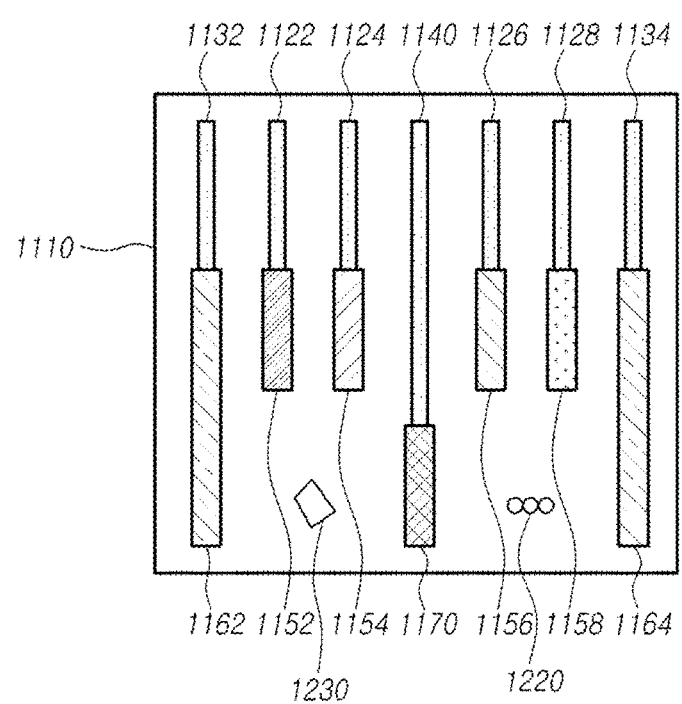
FIG. 12 is a view illustrating a state in which a foreign substance permeates into the integrated circuit bonding part illustrated in FIG. 11.

FIG. 12 is a view illustrating a state in which a foreign substance permeates into the integrated circuit bonding part illustrated in FIG. 11.

With reference to FIG. 12, in the integrated circuit bonding part 1110, the plurality of data pad electrodes 1152, 1154, 1156, and 1158 may be formed to be shorter than the driving voltage pad electrodes 1162 and 1164, and may be disposed at a location different from that of the reference voltage pad electrode 1170. Accordingly, it is possible to ensure a sufficiently large space between the driving voltage pad electrodes 1162 and 1164 and the reference voltage pad electrode 1170; and a sufficiently large space between the second data pad electrode 1154 and the third data pad electrode 1156 that are adjacent to the reference voltage pad electrode 1170.

Therefore, the integrated circuit bonding part 1110, according to the second example embodiment of the present invention, may have the plurality of data pad electrodes 1152, 1154, 1156, and 1158, and the reference voltage pad electrode 1170, that are disposed at different locations. Accordingly, even when conductive balls 1220 gather together or a minute foreign substance 1230 permeates into the integrated circuit bonding part 1110, it is possible to prevent failure caused by a short-circuit between the plurality of data pad electrodes 1152, 1154, 1156, and 1158, and the reference voltage pad electrode 1170.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display panel, comprising:
   a plurality of data lines arranged in a first direction;
   a plurality of gate lines arranged in a second direction to cross the data lines, a plurality of pixel areas being defined by the crossed data lines and gate lines;
   at least one driving voltage line arranged in the first direction;
   at least one reference voltage line arranged in the first direction;
   a plurality of data pads respectively disposed at ends of corresponding ones of the data lines;
   a driving voltage pad disposed at an end of the driving voltage line; and
   a reference voltage pad disposed at an end of the reference voltage line,
   wherein each of the data pads, the driving voltage pad, and the reference voltage pad are disposed in a non-active area of the display panel adjacent to an edge of the display panel and outside of the pixel areas,
   wherein a first distance from the edge of the display panel to the data pads is different than a second distance from the edge of the display panel to the driving voltage pad, and
   wherein the first distance from the edge of the display panel to the data pads is different than a third distance from the edge of the display panel to the reference voltage pad.

2. The organic light emitting diode display panel according to claim 1, wherein the second and third distances are substantially the same.

3. The organic light emitting diode display panel according to claim 1, wherein a length of the data pad in the first direction is substantially the same as a length of the reference voltage pad in the first direction.

4. The organic light emitting diode display panel according to claim 1, wherein a length of the driving voltage pad in the first direction is greater than a length of the data pad in the first direction.

5. An organic light emitting diode display device, comprising:
   a display panel including:
      a plurality of data lines arranged in a first direction,
      a plurality of gate lines arranged in a second direction to cross the data lines, a plurality of pixel areas being defined by the crossed data lines and gate lines,
      at least one driving voltage line arranged in the first direction,
      at least one reference voltage line arranged in the first direction,
      a plurality of data pads respectively disposed at ends of corresponding ones of the data lines,
      a driving voltage pad disposed at an end of the driving voltage line, and
      a reference voltage pad disposed at an end of the reference voltage line; and
   an integrated circuit attached to the display panel, the integrated circuit having a plurality of terminals each connected to a respective one of the data pads, the driving voltage pad, and the reference voltage pad,
   wherein each of the data pads, the driving pad, and the reference voltage pad are disposed in a non-active area of the display panel adjacent to an end of the display panel and outside of the pixel areas,
   wherein a first distance from the edge of the display panel to the data pads is different than a second distance from the edge of the display panel to the driving voltage pad, and
   wherein the first distance from the edge of the display panel to the data pads is different than a third distance from the edge of the display panel to the driving reference voltage pad.

6. The organic light emitting diode display device according to claim 5, wherein at least one conductive ball is between each terminal and the one of the data pads, the driving voltage pad, and the reference voltage pad to which the terminal is connected.

7. The organic light emitting diode display device according to claim 5, wherein the second and third distances are substantially the same.

8. The organic light emitting diode display device according to claim 5, wherein a length of the data pad in the first direction is substantially the same as a length of the reference voltage pad in the first direction.

9. The organic light emitting diode display device according to claim 5, wherein a length of the driving voltage pad in the first direction is greater than a length of the data pad in the first direction.

* * * * *